(12) United States Patent
Moon et al.

(10) Patent No.: US 8,960,984 B2
(45) Date of Patent: Feb. 24, 2015

(54) BACKLIGHT UNIT INCLUDING COB TYPE LIGHT EMITTING DIODE MODULE

(75) Inventors: Kyung Mi Moon, Suwon-si (KR); Hak Hwan Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 217 days.

(21) Appl. No.: 13/594,014

(22) Filed: Aug. 24, 2012

(65) Prior Publication Data

US 2013/0051069 A1   Feb. 28, 2013

(30) Foreign Application Priority Data

Aug. 25, 2011   (KR) .................. 10-2011-0084894

(51) Int. Cl.
| | | |
|---|---|---|
| *F21V 8/00* | (2006.01) | |
| *G02F 1/1335* | (2006.01) | |
| *H01L 33/58* | (2010.01) | |

(52) U.S. Cl.
CPC ........ *G02B 6/0021* (2013.01); *G02F 1/133615* (2013.01); *H01L 33/58* (2013.01)
USPC ....................................................... 362/608

(58) Field of Classification Search
CPC .. G02B 6/0021; G02B 6/0015; G02B 6/0073; G02B 6/00; G02B 6/0011; G02B 6/0035; G02F 1/133615; G02F 1/133602; G02F 1/133603; H01L 33/58
See application file for complete search history.

(56) References Cited

U.S. PATENT DOCUMENTS

| | | | | |
|---|---|---|---|---|
| 7,083,317 | B2* | 8/2006 | Higashiyama | 362/612 |
| 7,470,034 | B2* | 12/2008 | Pang | 362/29 |
| 7,695,178 | B2* | 4/2010 | Suh et al. | 362/612 |
| 7,742,121 | B2* | 6/2010 | Mori et al. | 349/58 |
| 7,780,306 | B2* | 8/2010 | Hoshi | 362/97.1 |
| 2007/0284597 | A1* | 12/2007 | Nawashiro et al. | 257/89 |
| 2008/0031010 | A1 | 2/2008 | Kim et al. | |
| 2008/0049168 | A1* | 2/2008 | Kubota | 349/65 |
| 2008/0259641 | A1* | 10/2008 | Suzuki et al. | 362/612 |
| 2009/0046470 | A1* | 2/2009 | Lai et al. | 362/311 |
| 2009/0174300 | A1* | 7/2009 | Jousse et al. | 313/1 |
| 2009/0237592 | A1* | 9/2009 | Mizutani | 349/62 |
| 2010/0002465 | A1* | 1/2010 | Tsang et al. | 362/612 |
| 2010/0208492 | A1 | 8/2010 | Sugie et al. | |

FOREIGN PATENT DOCUMENTS

| | | |
|---|---|---|
| JP | 2003-107467 | 4/2003 |
| JP | 2005-099328 | 4/2005 |
| JP | 2006-228589 | 8/2006 |

(Continued)

OTHER PUBLICATIONS

Office Action for Korean Application No. 10-2011-0084894 dated Oct. 19, 2012.

*Primary Examiner* — Bao Q Truong
(74) *Attorney, Agent, or Firm* — Harness, Dickey & Pierce, P.L.C.

(57) ABSTRACT

A backlight unit (BLU) is disclosed. The BLU may include a light emitting diode (LED) module including at least one LED chip mounted on a substrate in a chip-on-board (COB) type, and a light guide panel including an incidence surface configured to receive light emitted from an emission surface of the LED chip and to include at least one insertion recess disposed corresponding to the LED chip, such that the LED chip is bonded to the LED module to be inserted in the insertion recess.

18 Claims, 17 Drawing Sheets

(56) References Cited

FOREIGN PATENT DOCUMENTS

| | | |
|---|---|---|
| JP | 2007265788 A | 10/2007 |
| JP | 2008041637 A | 2/2008 |
| JP | 2008-159659 | 7/2008 |
| KR | 10-1999-0003536 | 1/1999 |
| KR | 20080013127 A | 2/2008 |
| KR | 20090014494 A | 2/2009 |
| KR | 20100090243 A | 8/2010 |

* cited by examiner

200

300

810

BACKLIGHT UNIT INCLUDING COB TYPE LIGHT EMITTING DIODE MODULE

CROSS-REFERENCE TO RELATED APPLICATION

This application claims the benefit of Korean Patent Application No. 10-2011-0084894, filed on Aug. 25, 2011, in the Korean Intellectual Property Office, the disclosure of which is incorporated herein by reference.

BACKGROUND

1. Field of the Invention

The example embodiments relate to a backlight unit (BLU) including a chip-on-board (COB) type light emitting diode (LED) module.

2. Description of the Related Art

A backlight unit (BLU) provides light for lighting a display panel in a display device. The BLU includes a light source and a light guide panel. According to an arrangement of the light source with respect to the light guide panel, the BLU may be one of an edge type in which light sources are disposed on a side surface of a light guide panel, and a direct type in which light sources are disposed right under a light guide panel.

Conventionally, a fluorescent lamp has been used as the light source of the BLU. However, recently, the fluorescent lamp is being replaced by a light emitting diode (LED). A LED is superior in terms of environmental-friendliness, lifespan, and electrical characteristics relative to a conventional fluorescent lamp. However, conventional LEDs used as light sources are packaged LEDs, where each LED includes its own separate substrate. By using a packaged LED, the connection structure between the LED module and the display panel may be inefficiently designed.

FIG. 1 is a sectional view illustrating a structure of a BLU according to a conventional art.

Referring to FIG. 1, the BLU 10 includes an LED module 12 and a light guide panel 13 which are disposed in a housing 11.

Light emitted from the LED module 12 is incident upon the light guide panel 13 disposed corresponding to a light emission direction of the LED module 12. The LED module 12 and the light guide panel 13 are separated by a predetermined distance. Due to such a separate structure, the light emitted from the LED module 12 may be partially reflected and lost. Accordingly, incidence efficiency of the light from the LED module 12 incident upon the light guide panel 13 is reduced, thereby reducing quality of the BLU 10.

The LED module 12 is manufactured by structuring an LED package in such a manner that an LED chip 12c is mounted on a package substrate 12b one by one, and then electrically bonding a plurality of the LED packages on a substrate 12a. Use of the package substrate 12b and the substrate 12 increases the number of processes and manufacturing cost of the LED module 12. Consequently, reducing an outer thickness of the BLU 10 is limited.

SUMMARY

An example embodiment provides a backlight unit (BLU) that reduces an outer thickness of the BLU by employing a chip-on-board (COB) type light emitting diode (LED) module, and increases incidence efficiency of light emitted from the LED module by improving a connection structure between the COB-type LED module and a light guide panel.

According to an example embodiment, there is provided a BLU including an LED module and a light guide panel. The LED module including at least one LED chip mounted on a substrate in a COB type; and a light guide panel including an incidence surface configured to receive light emitted from an emission surface of the LED chip, the incidence surface including at least one insertion recess disposed to correspond to the LED chip, such that the LED chip is bonded to the LED module to be inserted in the insertion recess.

The insertion recess may include a transparent resin injected in the insertion recess to bond the LED chip.

The insertion recess may be formed on the incidence surface in a shape of a light extraction pattern, the light extraction pattern configured to maximize an efficiency of light emitted from the LED chip.

The incidence surface may include at least one receiving recess disposed in a region excluding the insertion recess and configured to receive residue of the transparent resin.

The substrate may include at least one injection hole extending from a first surface to a second surface of the substrate as a path for injecting the transparent resin into the insertion hole.

The injection hole may be disposed in a region corresponding to the insertion recess on the substrate while excluding a region corresponding to the LED chip.

The light guide panel may further include an adhesive layer disposed in a region excluding the insertion recess on the incidence surface so as to bond the incident surface to a surface of the substrate.

The LED module may include at least one connection recess disposed in a region excluding the LED chip on a surface of the substrate on which the LED chip is mounted, and the light guide panel may include a connection projection disposed in a region corresponding to the connection recess on the incidence surface, the connection projection configured to be engaged with the connection recess.

The LED module may include a first alignment mark disposed on a surface of the substrate on which the LED chip is mounted, and the light guide panel may include a second alignment mark that matches the first alignment mark and is configured to guide the LED chip into the insertion recess.

The LED module may further include a transparent lens unit applied on the LED chip.

According to another example embodiment, there is provided a manufacturing method for a BLU using a light emitting diode (LED) module having at least one LED chip directly mounted on a substrate in a chip-on-board (COB) design. The manufacturing method including bonding a light guide panel to the LED chip, the light guide panel including an incidence surface configured to receive light emitted from an emission surface of the LED chip and the at least one insertion recess disposed to correspond to the LED chip, such that the LED chip is configured to be inserted in the insertion recess when bonding the light guide panel to the LED chip.

The bonding of the light guide panel may include injecting a transparent resin in the insertion recess to bond the LED chip; and inserting the LED chip in the insertion recess and bonding the light guide panel to the LED chip by the transparent resin.

The bonding of the light guide panel may include disposing the light guide panel at one side of the LED module such that the LED chip is inserted in the insertion recess; and bonding the light guide panel to the LED chip by injecting a transparent resin in the insertion recess through at least one injection hole extending from a first exterior surface to a second interior surface of the substrate.

The method may include applying a transparent lens unit on the LED chip.

The bonding of the light guide panel may include forming an adhesive layer in a region excluding the insertion recess on the incidence surface; and disposing the light guide panel at one side of the LED module such that the transparent lens unit is inserted in the insertion recess and bonding the incidence surface to a surface of the substrate on which the LED chip is mounted by the adhesive layer.

The bonding of the light guide panel may further include engaging at least one connection recess formed on the substrate with a connection project formed on the light guide panel, the at least one connection recess disposed on the substrate in a region excluding the LED chip and the connection projection disposed on the incidence surface in a region corresponding to the at least one connection recess.

The bonding of the light guide panel may further include matching a first alignment mark disposed on a surface of the substrate, to a second alignment mark, the first align mark and the second align mark together are configured to guide the LED chip into the insertion recess on the incidence surface.

According to another example embodiment, there is provided a backlight unit. The backlight unit having a light guide panel including a first surface having insertion recesses; and LED chips mounted on and electrically interconnected to a first surface of a substrate and disposed inside the insertion recesses.

According to another example embodiment, there is provided a manufacturing method. The method including mounting LED chips onto a substrate via a direct chip attachment procedure, the direct chip attachment procedure being a procedure where the LED chips are mounted on and electrically interconnected to a first surface of the substrate, forming insertion recesses on a first surface of a light guide panel, the first surface configured to receive light emitted from the LED chips and bonding the LED chips to the first surface by inserting the LED chips in the insertion recesses of the light guide panel such that the first surface of the light guide panel directly contacts the first surface of the substrate.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
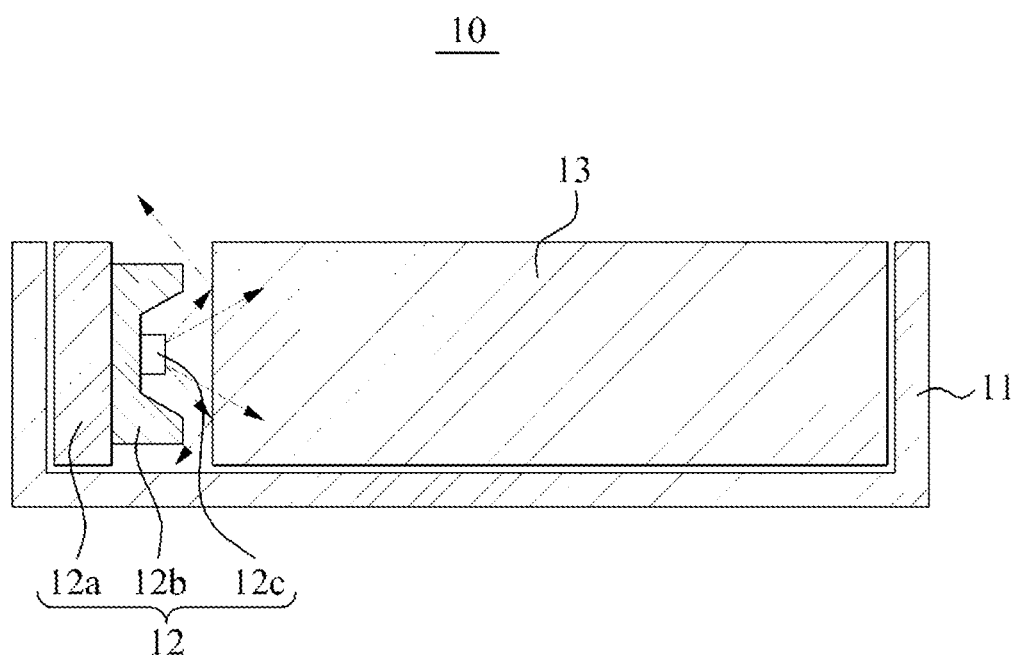
FIG. 1 is a sectional view illustrating a structure of a backlight unit (BLU) according to a conventional art.

Reference will now be made in detail to example embodiments, examples of which are illustrated in the accompanying drawings, wherein like reference numerals refer to the like elements throughout. In the following description, when it is determined that a detailed description of well-known functions related to the present invention and the construction thereof would make the gist of the present invention obscure, they will be omitted.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments of the present invention will now be described more fully with reference to the accompanying drawings in which some example embodiments of the invention are shown. In the drawings, the thicknesses of layers and regions are exaggerated for clarity.

The terminology used herein is for the purpose of describing particular embodiments only and the definition may be varied according to the intention of a user, an operator, or customs. Therefore, the terms and words should be defined based on a description of this specification.

Figure 2:
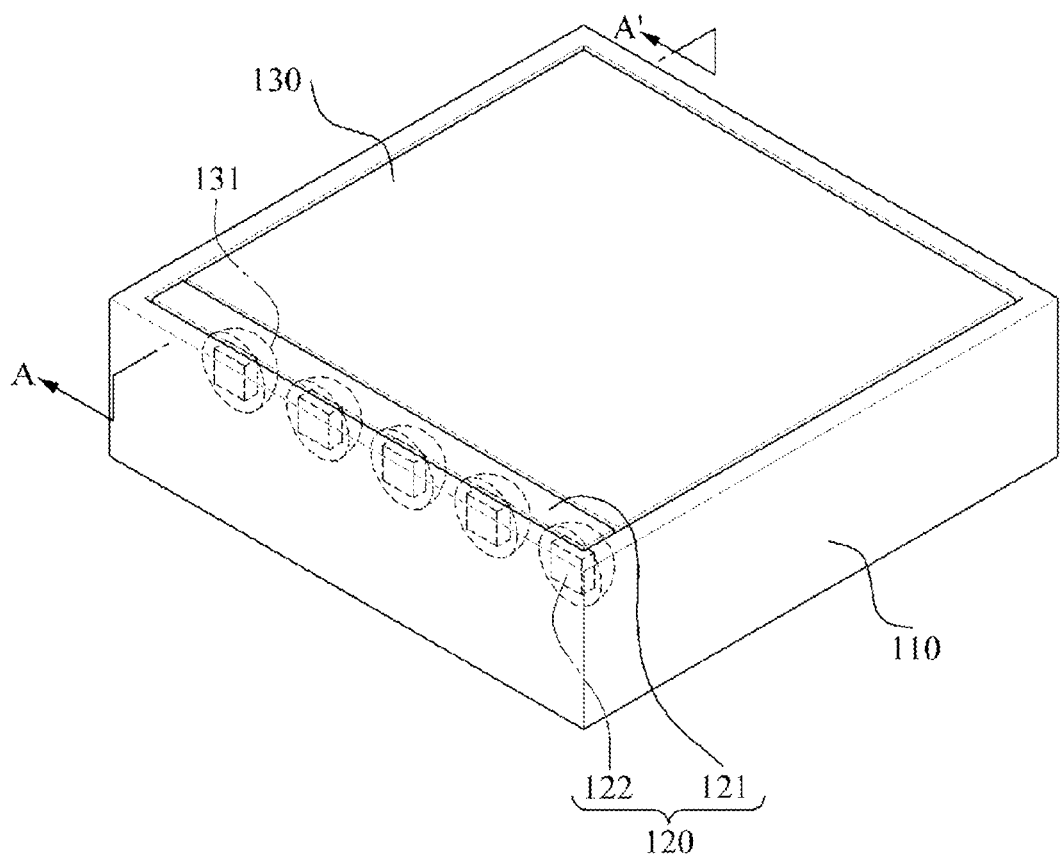
FIG. 2 is a perspective view illustrating a structure of a BLU according to an example embodiment.

FIG. 2 is a sectional diagram illustrating a structure of a backlight unit (BLU) according to an example embodiment. Referring to FIG. 2, a BLU 100 includes a housing 110, a light emitting diode (LED) module 120 and a light guide panel 130.

The housing 110 may receive the LED module 120 and the light guide panel 130.

Figure 3:
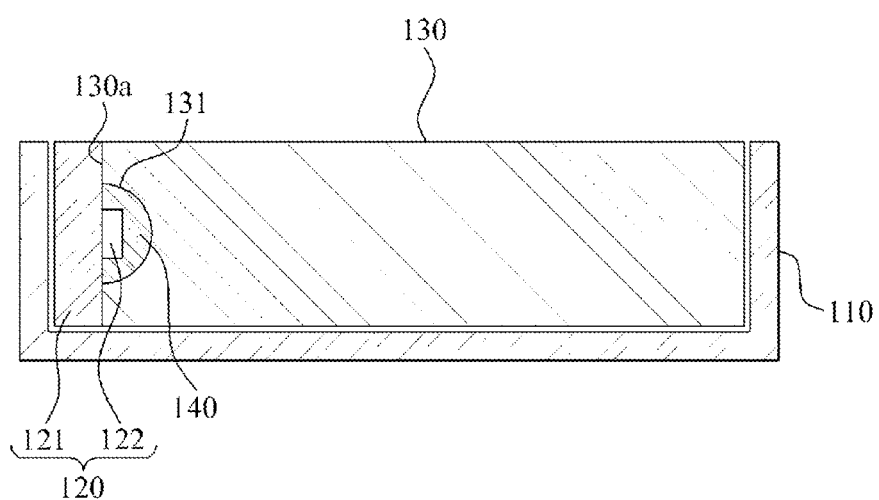
FIGS. 3 and 4 are a sectional view and a perspective view, respectively, illustrating a structure of the BLU of FIG. 2.
Figure 4:
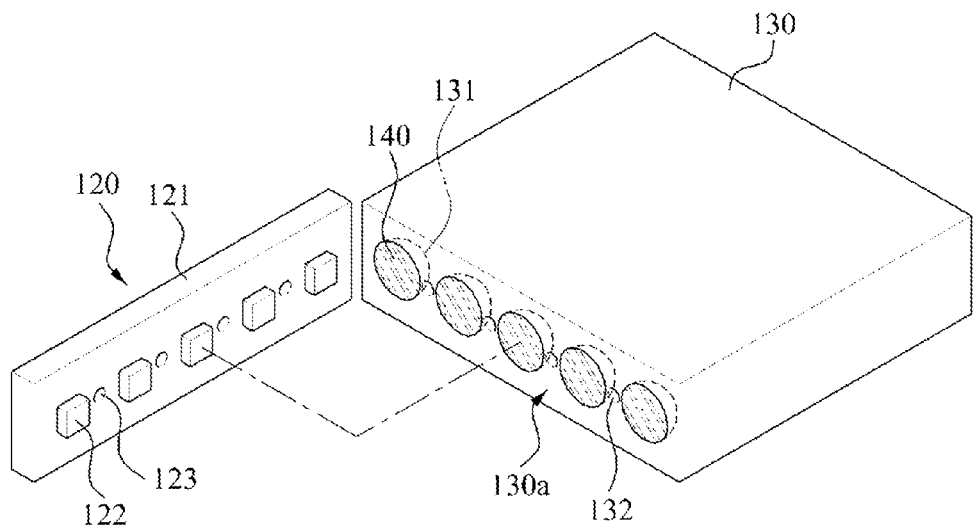

Structures of the LED module 120 and the light guide panel 130 will be described in detail with reference to FIGS. 3 and 4. FIG. 3 is a sectional view of the BLU 100 cut along a line A-A'. FIG. 4 is a perspective view illustrating the LED module 120 separated from the light guide panel 130.

Referring to FIGS. 3 and 4, the LED module 120 includes a substrate 121 and at least one LED chip 122. The LED chip 122 is mounted on the substrate 121 in a chip-on-board (COB) type LED. The COB type LED refers to a mounting type in which the LED chip 122 is mounted in an unpackaged state on the substrate 121. More specifically, the LED chip 122 is mounted directly on the substrate 121 without being mounted on a separate package substrate. Accordingly, the LED module 120 may be reduced in thickness.

The light guide panel 130 may include an incidence surface 130a for receiving light emitted from an emission surface of the LED chip 122.

The incidence surface 130a may include at least one insertion recess 131 disposed to correspond to the LED chip 122. According to an example embodiment, the insertion recess 131 has a size larger than the LED chip 122 to receive the LED chip 122.

Referring to FIG. 3, the light guide panel 130 may be bonded to the LED module 120 such that the LED chip 122 is inserted in the insertion recess 131 included in the incidence surface 130a. A transparent resin 140 fills an inside of the insertion recess 131 to enable bonding of the LED chip 122 to the insertion recess 131.

As the LED chip 122 is completely inserted in the insertion recess 131, the incidence surface 130a of the light guide panel 130 may physically contact a surface of the substrate 121 on which the LED chip 122 is mounted, in the LED module 120. Accordingly, there is not any gap between the LED 122 chip and the incidence surface 130a to cause a loss of light between the light guide panel 130 and the LED module 120.

Referring to FIG. 4, the incidence surface 130a of the light guide panel 130 may include at least one receiving recess 132. The at least one receiving recess 132 may be disposed in a region excluding the insertion recess 131 and configured to receive residue of the transparent resin 140. That is, according to a manufacturing process, the transparent resin 140 is injected in the insertion recess 131 included in the incidence surface 130a and, in this state, the light guide panel 130 and the LED module 120 are bonded to each other. During the foregoing process, the transparent resin 140 may partially flow out to the incidence surface 130a. The flowing part, that is, the residue of the transparent resin 140 may form desired (or, alternatively a predetermined) thickness, thereby generating a gap between the LED module 120 and the light guide panel 130. By directing the residue of the transparent resin 140 into the at least one receiving recess 132, generation of the gap between the LED module 120 and the light guide panel 130 may be prevented.

In the LED module 120, at least one receiving recess 123 may be included in the surface of the substrate 121 on which the LED chip 122 is mounted. The at least one receiving recess 123 of the LED module 120 may be disposed to correspond to the receiving recess 132 of the light guide panel 130.

Figure 5:
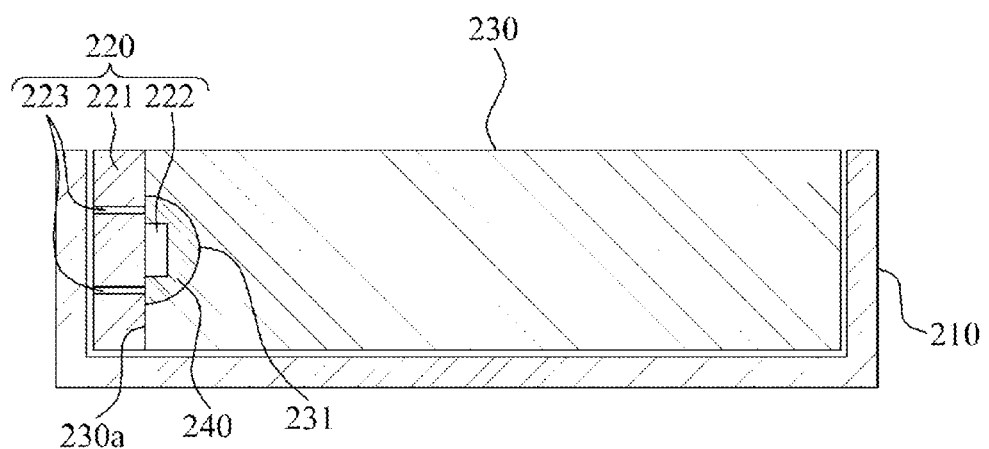
FIG. 5 is a sectional view illustrating a structure of a BLU according to another example embodiment.

FIG. 5 is a sectional view illustrating a structure of a BLU according to another example embodiment. Referring to FIG. 5, a BLU 200 includes a housing 210, an LED module 220, and a light guide panel 230.

The housing 210 may receive the LED module 220 and the light guide panel 230.

The LED module 220 may include a substrate 221 and at least one LED chip 222 mounted on the substrate 221 in a COB type.

The substrate 221 includes at least one injection hole 223 disposed around the LED chip 222. The injection hole 223 is used as a path for injecting a transparent resin 240, in manufacturing the BLU 200 shown in FIG. 5. Hereafter, the injection hole 223 will be described in further detail along with a structure of the light guide panel 230.

The light guide panel 230 includes an incidence surface 230a. As in the example embodiment shown in FIGS. 2 to 4, the incidence surface 230a may include at least one insertion recess 231 disposed corresponding to the LED chip 222.

According to a manufacturing process of the BLU 200 of FIG. 5, in a state where the insertion recess 231 of the incidence surface 230a is kept empty, that is, the insertion recess 231 is not filled with the transparent resin 240, the light guide panel 230 is disposed at one side of the LED module 220. Accordingly, the LED chip 222 is fully inserted in the insertion recess 231. Next, the transparent resin 240 is injected in the insertion recess 231 to bond the LED chip 222 to the insertion recess 231. Here, the injection holes 223 are used for injecting the transparent resin 240.

The injection holes 223 are paths extending from one surface to the other surface of the substrate 221 for injection of the transparent resin 240. The transparent resin 240 is injected through the injection holes 223 into the insertion recess 231, thereby bonding the insertion recess 231 and the LED chip 222 to each other.

Although not shown in FIG. 5, the LED module 220 may include a first alignment mark on a surface of the substrate 221 on which the LED chip 222 is mounted, whereas the light guide panel 230 includes a second alignment mark on the incidence surface 230a. The second alignment mark is matched to the first alignment mark to guide the LED chip 222 to ensure correct insertion of the LED chip 222 into the insertion recess 231.

Figure 6:
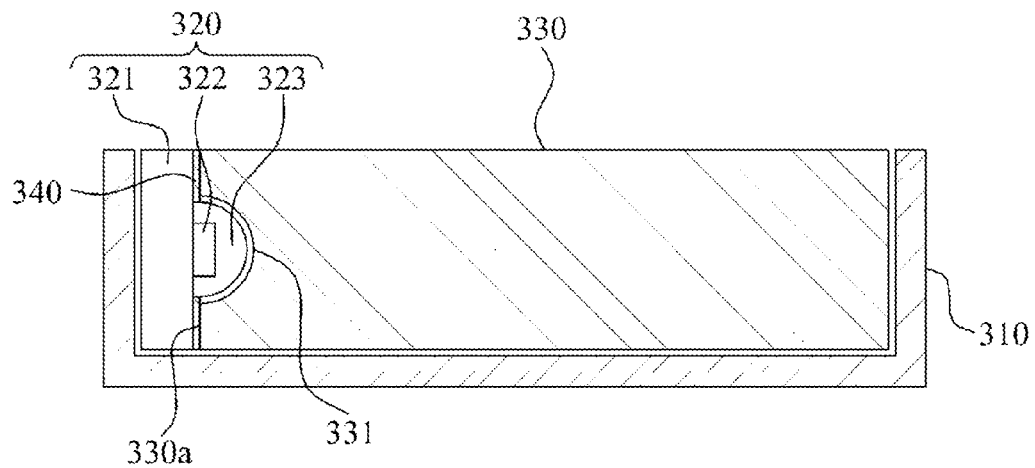
FIG. 6 is a sectional view illustrating a structure of a BLU according to still another example embodiment.

FIG. 6 is a sectional view illustrating a structure of a BLU according to still another example embodiment. Referring to FIG. 6, a BLU 300 includes a housing 310, an LED module 320, and a light guide panel 330.

The housing 310 receives the LED module 320 and the light guide panel 330.

The LED module 320 may include a substrate 321, an LED chip 322, and a transparent lens unit 323.

The LED chip 322 may be mounted on the substrate 321 in a COB type and may be consist of one or more LED chips 322. A corresponding transparent lens unit 323 is disposed on each of the one or more LED chips 322.

The light guide panel 330 may include an incidence surface 330a. As in the embodiment shown in FIGS. 2 to 4, the incidence surface 330a may include at least one insertion recess 331 disposed corresponding to the LED chip 322.

The insertion recess 331 is a space for receiving the LED chip 322. More specifically, the insertion recess 331 receives the LED chip 322 along with the transparent lens unit 323 formed on the LED chip 322. Therefore, the insertion recess 331 may have a shape and size corresponding to the transparent lens unit 323.

The embodiment shown in FIG. 6 includes an adhesive layer 340 disposed on the incidence surface 330a.

The adhesive layer 340 may be disposed in a region excluding the insertion recess 331 on the incidence surface 330a and configured to bond the incidence surface 330a to a surface of the substrate 321 of the LED module 320. The adhesive layer 340 may be made of silicone resin or epoxy resin and applied in a uniform thickness on the incidence surface 330a.

When the adhesive layer 340 is excessively thick, loss of light may be generated between the LED module 320 and the light guide panel 330 due to the adhesive layer 340. Therefore, the adhesive layer 340 may be formed to be as thin as possible within a thickness range for enabling bonding between the light guide panel 330 and the LED module 320. In addition, the thickness of the adhesive layer 340 may be varied according to size and weight of the light guide panel 330 and the LED module 320.

Although not shown in FIG. 6, the substrate 321 may include at least one connection recess disposed in a region excluding the LED chip 322 on the surface of the substrate 321 on which the LED chip 322 is mounted.

In addition, the light guide panel 330 may include at least one connection projection disposed on the incidence surface 330a. The at least one connection projection may be disposed in a region corresponding to the connection recess of the substrate 321 to be engaged with the connection recess. The connection projection and the connection recess may serve as an auxiliary bonding structure that helps bonding between the light guide panel 330 and the LED module 320. Therefore, the light guide panel 330 and the LED module 320 may be bonded to each other by the adhesive layer 340 and bonded by the connection projection and the connection recess. Thus, reliability in a bonding force may be increased.

According to the embodiments shown in FIGS. 2 to 6, since the LED chips 122, 222, and 322 are mounted on the substrates 121, 221, and 321 in the COB type, respectively, outer thicknesses of the BLUs 100, 200, and 300 may be reduced relative to a conventional packaged LED.

Furthermore, since a gap between the LED modules 120, 220, and 320 and the light guide panels 130, 230, and 330 is removed, loss of light generated from the LED chips 122, 222, and 322 may be prevented. As a result, incidence efficiency of light incident to the light guide panels 130, 230, and 330 may be increased relative to a conventional packaged LED.

Figure 7:
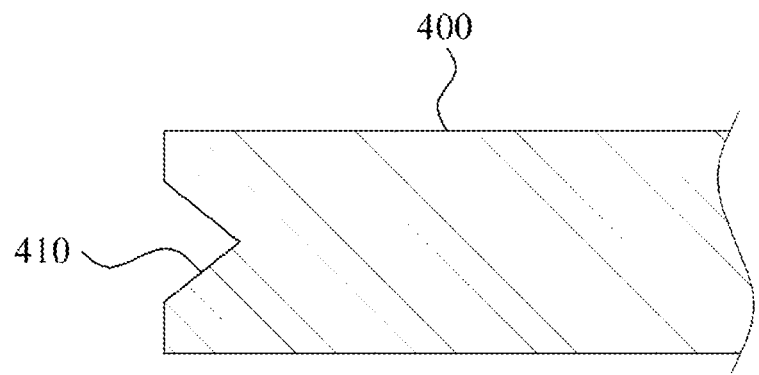
FIGS. 7 and 8 are sectional views illustrating a structure of a light guide panel according to various example embodiments.
Figure 8:
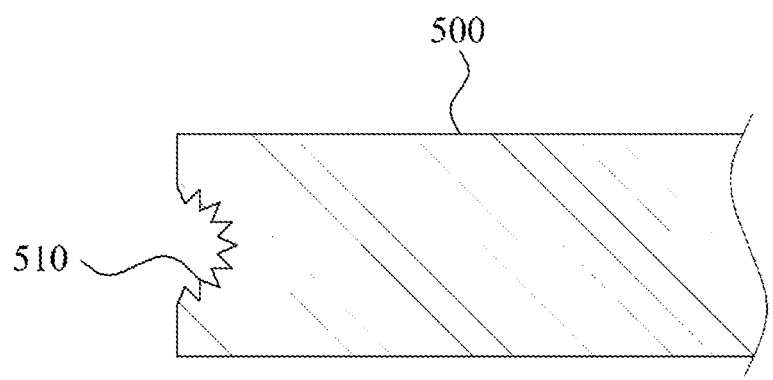

FIGS. 7 and 8 are sectional diagrams illustrating a structure of light guide panels 400 and 500 according to various example embodiments. In the embodiments of FIGS. 2 to 6, the insertion recesses 131, 231, and 331 included in the light guide panels 130, 230, and 330 may have a hemispheric shape. However, the insertion recesses 131, 231, and 331 may have shapes other than the hemispheric shape, examples of which are illustrated in FIGS. 7 and 8.

Referring to FIG. 7, the light guide panel 400 includes an insertion recess 410 having a pyramidal shape. Referring to FIG. 8, the light guide panel 500 includes an insertion recess 510 in an uneven surface shape. The pyramidal shape and the uneven surface shape, as a light extraction pattern, may increase extraction efficiency of light emitted from the LED chip and facilitate incidence and mixing of the light.

Besides the pyramidal shape or the uneven surface shape, the light extraction pattern applicable to the insertion recesses 410 and 510 may have a conical shape, a triangular shape, an inverse pyramidal shape, an oval shape, and the like.

FIGS. 9 to 12 are diagrams illustrating a manufacturing method of a BLU, according to an example embodiment.

Figure 9:
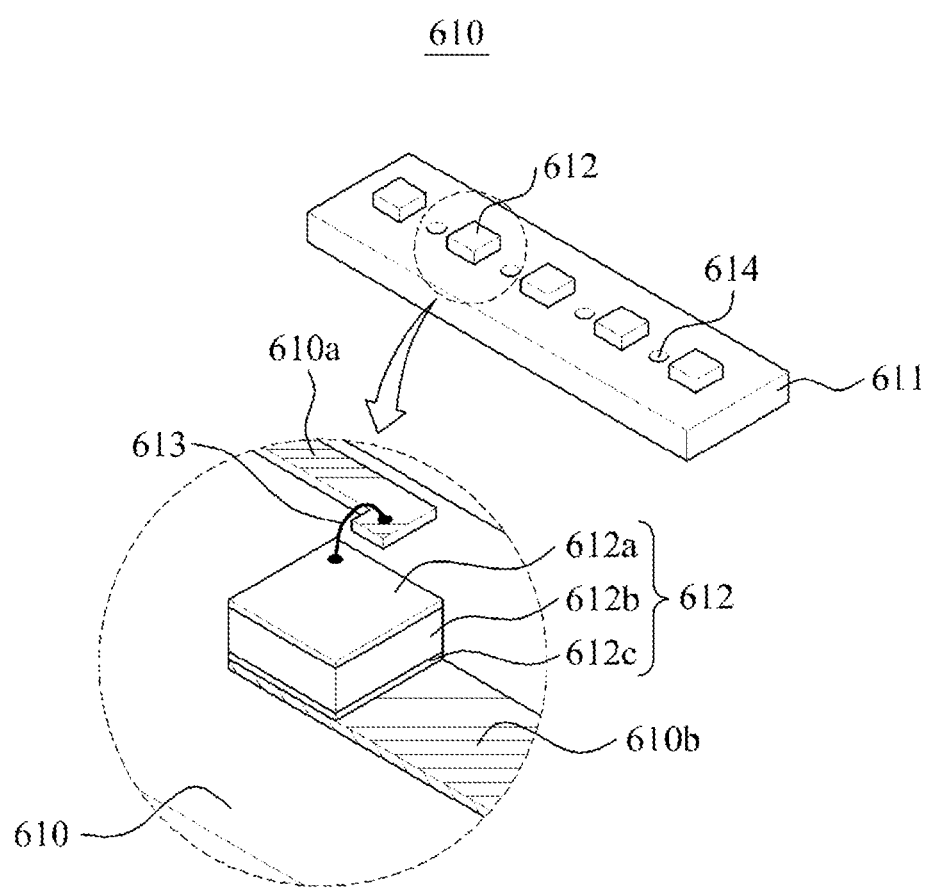
FIGS. 9 to 12 are diagrams illustrating a manufacturing method of a BLU, according to an example embodiment.

Referring to FIG. 9, the manufacturing method may include providing an LED module 610. Specifically, the LED module 610 including an LED chip 612 mounted in the COB type on a substrate 611, for example a printed circuit board, may be provided.

Referring to FIG. 9, the manufacturing method may include forming a first receiving recess 614 on the substrate 611. The first receiving recess 614 may be disposed between the LED chips 612. Herein, the first receiving recess 614 will be described along with a structure of a light guide panel 620. Referring to a partially enlarged view of the LED module 610, the substrate 611 may include a first circuit pattern 610a and a second circuit pattern 610b. In addition, the LED chip 612 may include a light emitting structure 612b which is a lamination of a first semiconductor layer, an active layer, and a second semiconductor layer, a first electrode 612a disposed on an upper surface of the light emitting structure 612b, and a second electrode 612c disposed on a lower surface of the light emitting structure 612b.

The first electrode 612a is electrically connected with the first circuit pattern 610a through a wire 613. The second electrode 612c is electrically connected with the second circuit pattern 610b through a conductive bonding material (not shown). That is, the LED chip 612 is mounted on the substrate 611 in the COB type.

Figure 10:
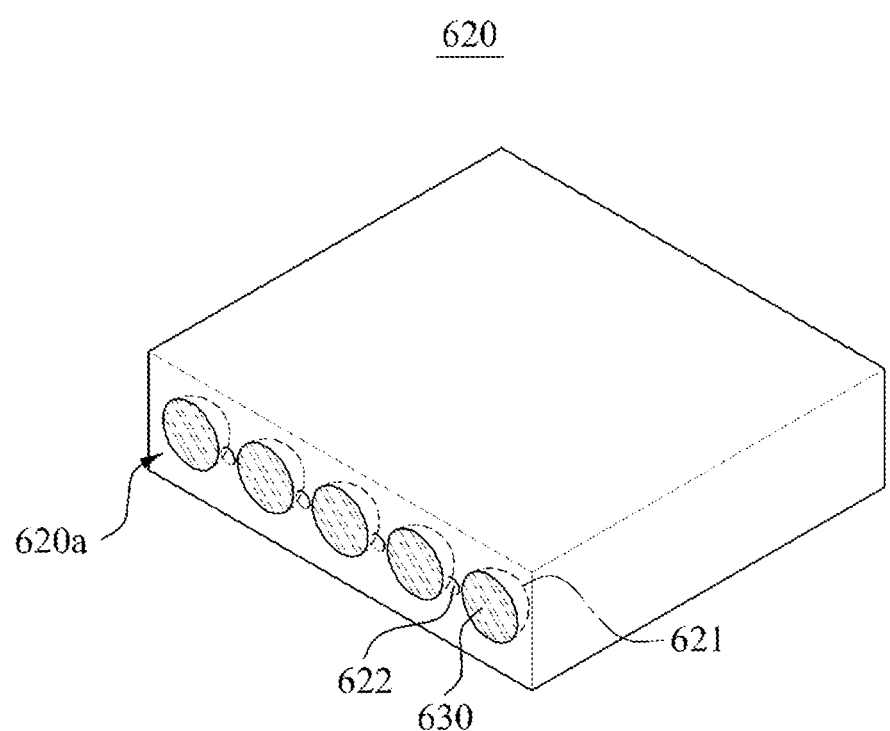

Referring to FIG. 10, the manufacturing method may include injecting a transparent resin 630 in the insertion recess 621 to be used in bonding the LED chip 612 to the light guide panel 620.

The light guide panel 620 according to the present embodiment is disposed at one side of the LED module 610 to receive light emitted from an emission surface of the LED chip 612. Also, the light guide panel 620 may include the insertion recess 621 disposed to correspond to the LED chip 612 on an incidence surface 620a.

Figure 11:
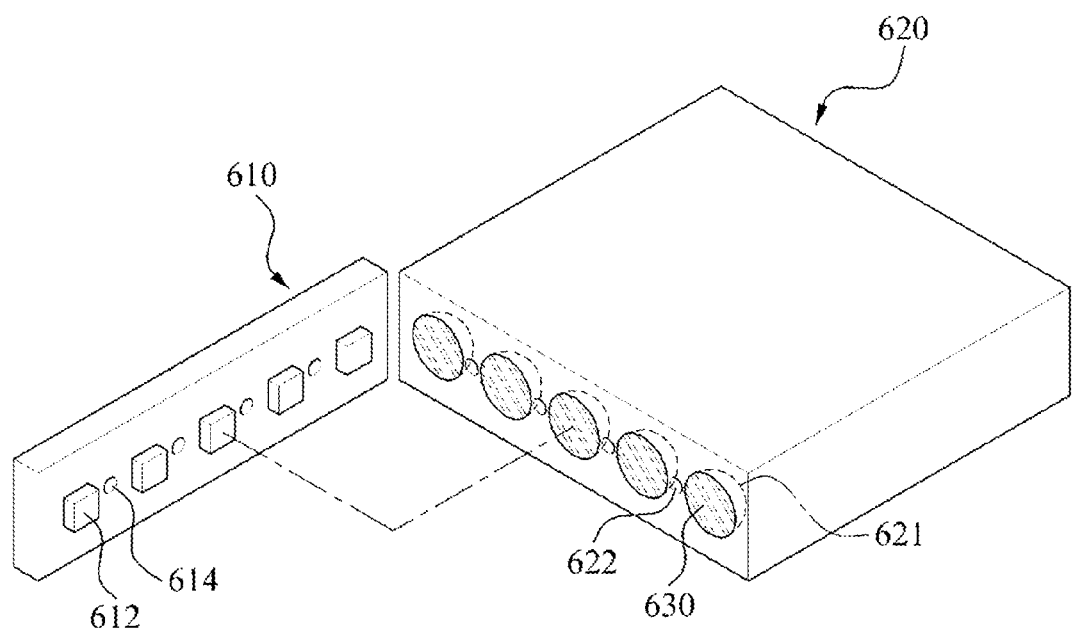

Referring to FIG. 11, the manufacturing method may include bonding the light guide panel 620 and the LED chip 612 to each other by the transparent resin 630, by inserting the LED chip 612 in the insertion recess 621. As the light guide panel 620 and the LED chip are bonded to each other, the incidence surface 620a of the light guide panel 620 may physically contact a surface of the substrate on which the LED chip 612 is mounted.

Referring to FIGS. 10 and 11, the manufacturing method may include forming a second receiving recess 622 on the light guide panel 620 for receiving residue of the transparent resin 630. The second receiving recess 622 may be disposed in a region corresponding to the first receiving recess 614 included in the substrate of the LED module 610.

During insertion of the LED chip 612 in the insertion hole 621, the transparent resin 630 may partially flow out to a bonding surface between the substrate and the incidence surface 620a. Here, the first receiving surface 614 and the second receiving surface 622 may receive the out flow, that is, the residue of the transparent resin 630. As a result, the first receiving surface 614 and the second receiving surface 622 may prevent a gap between the LED module 610 and the light guide panel 620 from being generated by the residue of the transparent resin 630.

Figure 12:
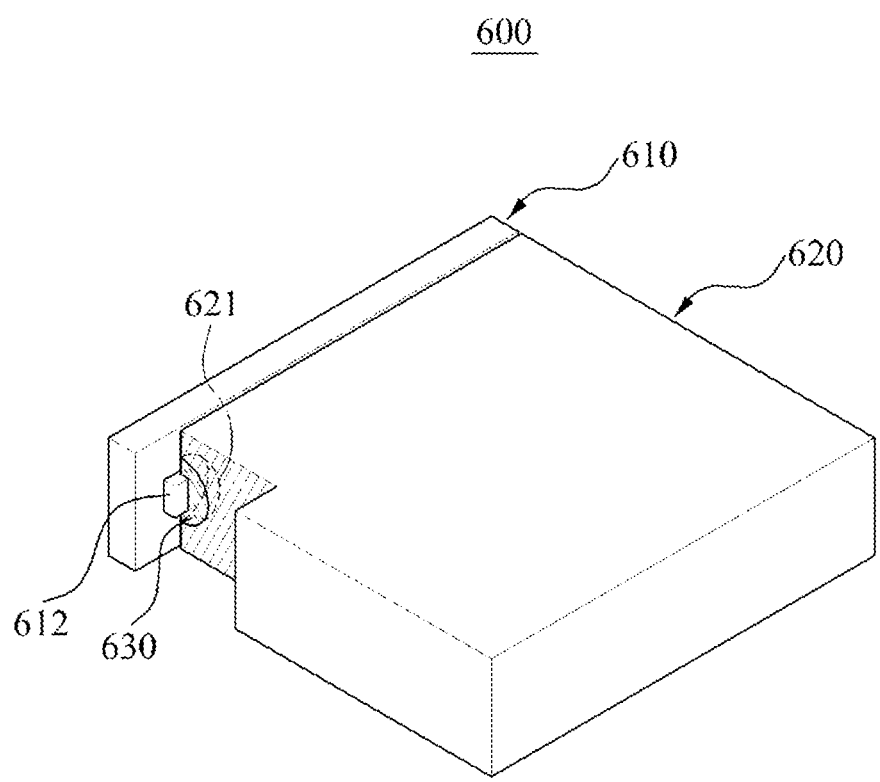

FIG. 12 shows a BLU 600 including the LED module 610 and the light guide panel 620.

Referring to a partially cutaway view, the LED chip 612 is fully inserted in the insertion recess 621 and the LED chip 612, and the insertion recess 621 are bonded to each other by the transparent resin 630. The incidence surface 620a of the light guide panel 620 is in physical contact with the surface of the substrate on which the LED chip 612 is mounted in the LED module 610. Therefore, any gap causing loss of light is not generated between the light guide panel 620 and the LED module 610.

FIGS. 13 to 16 are diagrams illustrating a manufacturing method of a BLU, according to another example embodiment.

Figure 13:
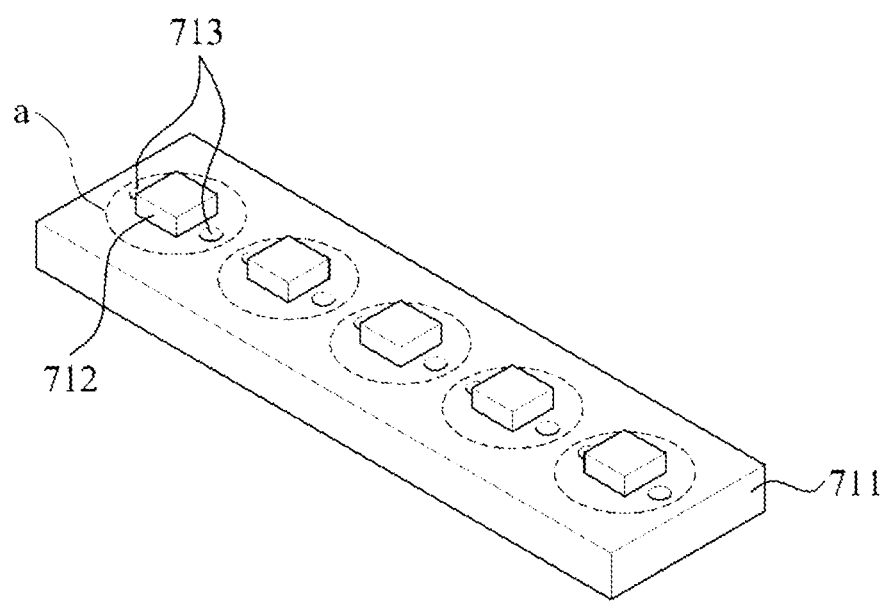
FIGS. 13 to 16 are diagrams illustrating a manufacturing method of a BLU, according to another example embodiment.

Referring to FIG. 13, the manufacturing method may include providing an LED module 710. The LED module 710 includes an LED chip 712 mounted on a substrate 711.

Mounting of the LED chip 712 on the substrate 711 is performed in the same manner as shown in FIG. 9. However, in the manufacturing method shown in FIG. 13, the LED module 710 includes an injection hole 713 formed on the substrate 711.

The injection hole 713 serves as a path for injecting a transparent resin, extending from one surface to another surface of the substrate 711. In addition, the injection hole 713 may be disposed in a region excluding the LED chip 712 within a first region a. The first region a may correspond to an insertion recess included in a light guide panel.

Figure 14:
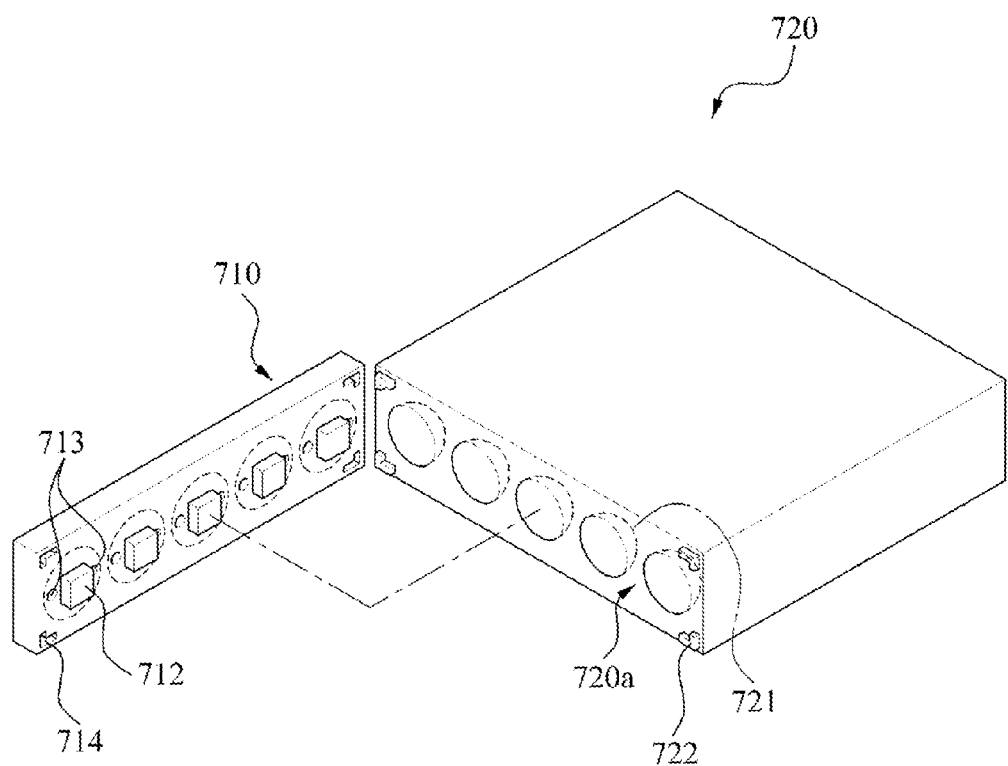

Referring to FIG. 14, the manufacturing method may include disposing a light guide panel 720 at one side of the LED module 710 such that the LED chip 712 is inserted in an insertion recess 721 included in an incidence surface 720a of the light guide panel 720.

The light guide panel 720 includes the insertion recess 721 disposed on the incidence surface 720a that faces the LED module 710. The insertion recess 721 is disposed corresponding to the LED chip 712 on the incidence surface 720a. According to the foregoing structure, when the light guide panel 720 is disposed at one side of the LED module 710, the LED chip 712 may be inserted in the insertion recess 721.

The manufacturing method may include forming a first alignment mark 714 disposed on the LED module 710 at a surface of the substrate on which the LED chip 712 is mounted. The manufacturing method may further include forming a second alignment mark 722 the incidence surface 720a of the light guide panel 720. The second alignment mark 722 may be matched to the first alignment mark 714 to guide the LED chip 712 to be correctly inserted in the insertion recess 721. The first alignment mark 714 and the second alignment mark 722 may be marks including a predetermined symbol, and may have an embossed pattern and a depressed pattern as shown in FIG. 14.

Figure 15:
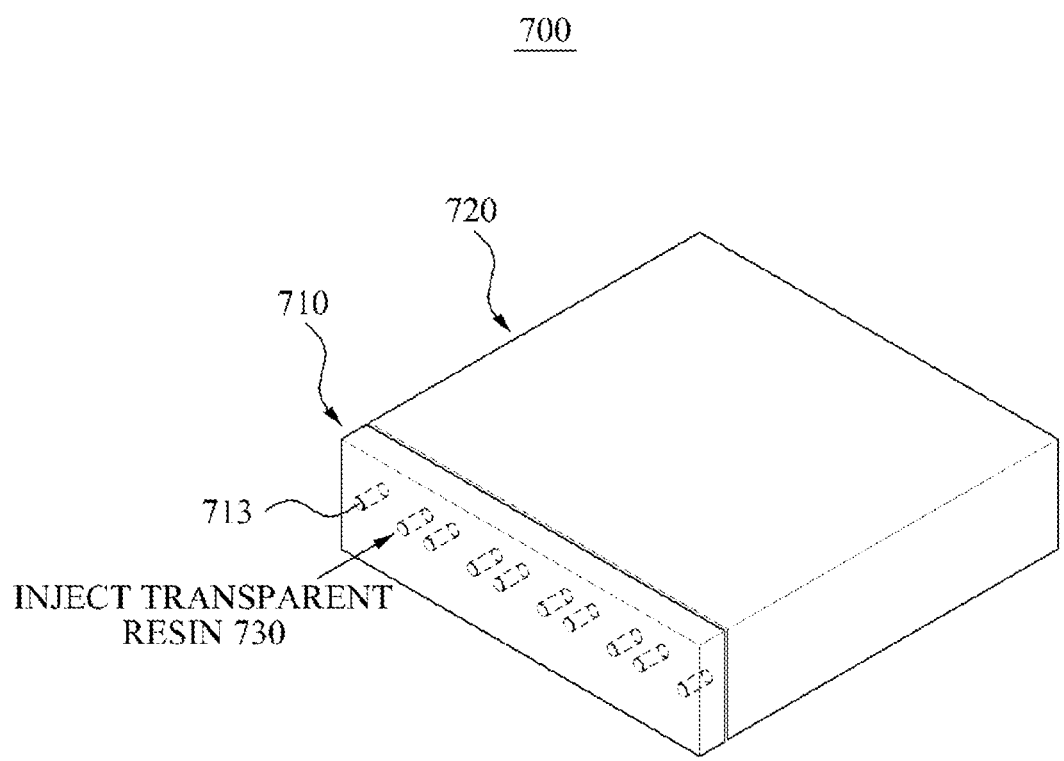

Referring to FIG. 15, the manufacturing method may include bonding the light guide panel 720 and the LED chip 712 to each other by injecting a transparent resin 730 into the insertion recess 721 through the injection hole 713 of the substrate 711.

Although not shown, when the transparent resin 730 is injected through the injection hole 713 of the substrate 711, the substrate 711 may further include a vent unit (not shown) to discharge air from the insertion recess 721. The vent unit may have a hollow structure extending from one surface to another surface of the substrate 711 in the same manner as the injection hole 713. Alternatively, a recess may be formed in a predetermined thickness on the surface of the substrate 711, on which the LED chip 712 is mounted, to have a hollow structure extending in a lateral direction of the substrate 711.

Figure 16:
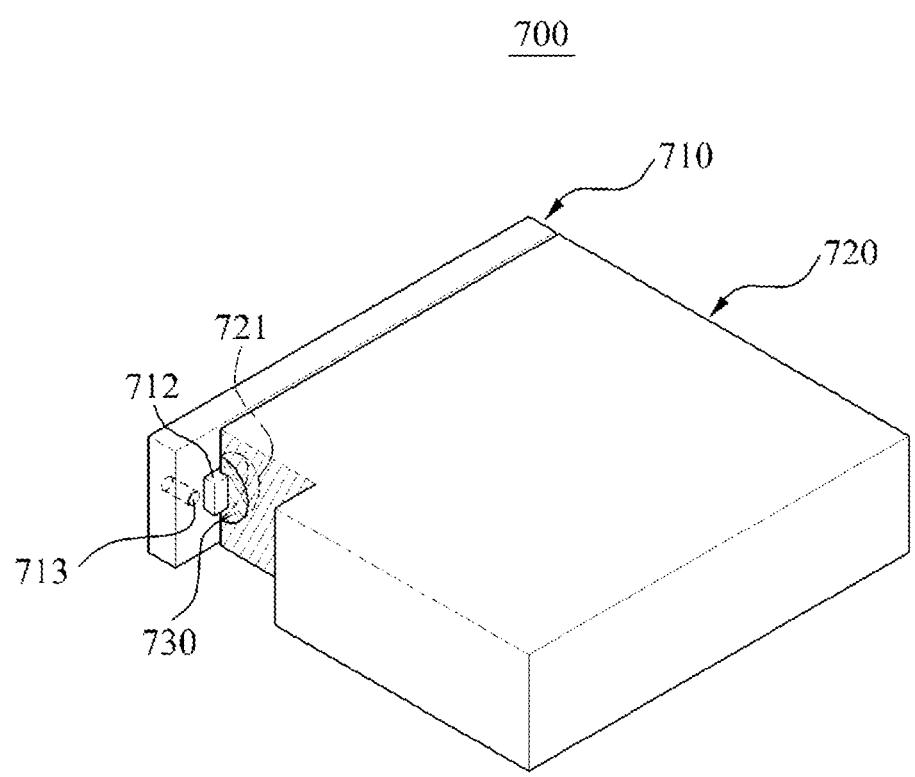

FIG. 16 shows the BLU 700 including the LED module 710 and the light guide panel 720. Referring to a partially cutaway surface in FIG. 16, the LED chip 712 and the light guide panel 720 are bonded to each other by the transparent resin 730 injected through the injection hole 713. The incidence surface of the light guide panel 720 may be in physical contact with the surface of the substrate on which the LED chip 712 is mounted in the LED module 710.

FIGS. 17 to 20 are diagrams illustrating a manufacturing method of a BLU, according to still another example embodiment.

Figure 17:
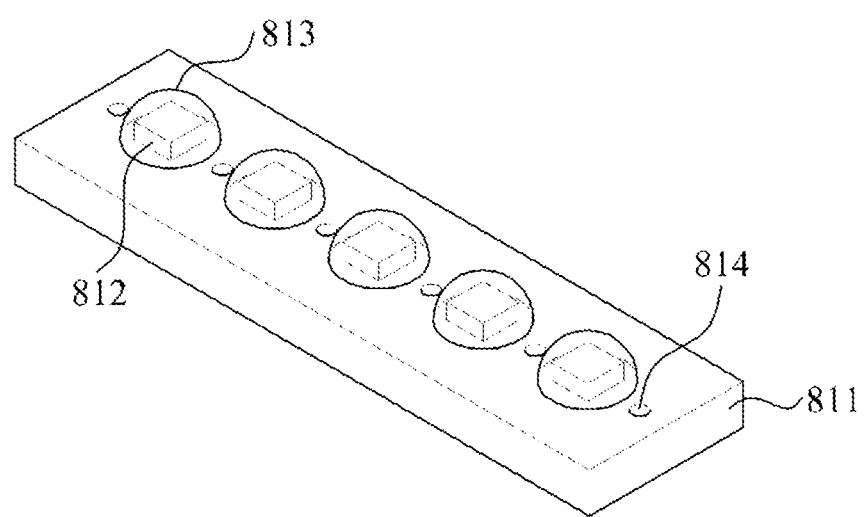
FIGS. 17 to 20 are diagrams illustrating a manufacturing method of a BLU, according to still another example embodiment.

Referring to FIG. 17, the manufacturing method may include providing an LED module 810. Specifically, the LED module 810 includes an LED chip 812 mounted in a CB type on a substrate 811.

The providing of the LED module 810 may include forming a transparent lens unit 813 on the LED chip 812. The transparent lens unit 813 may be formed by applying and curing a transparent resin such as silicone resin or epoxy resin on the LED chip 812.

The manufacturing method may include forming at least one connection recess 814 on the substrate 811 disposed in a region excluding the LED chip 812 on a surface on which the LED chip 812 is mounted. According to an example embodiment, the connection recess 814 may be provided between respective transparent lens units 813.

Figure 18:
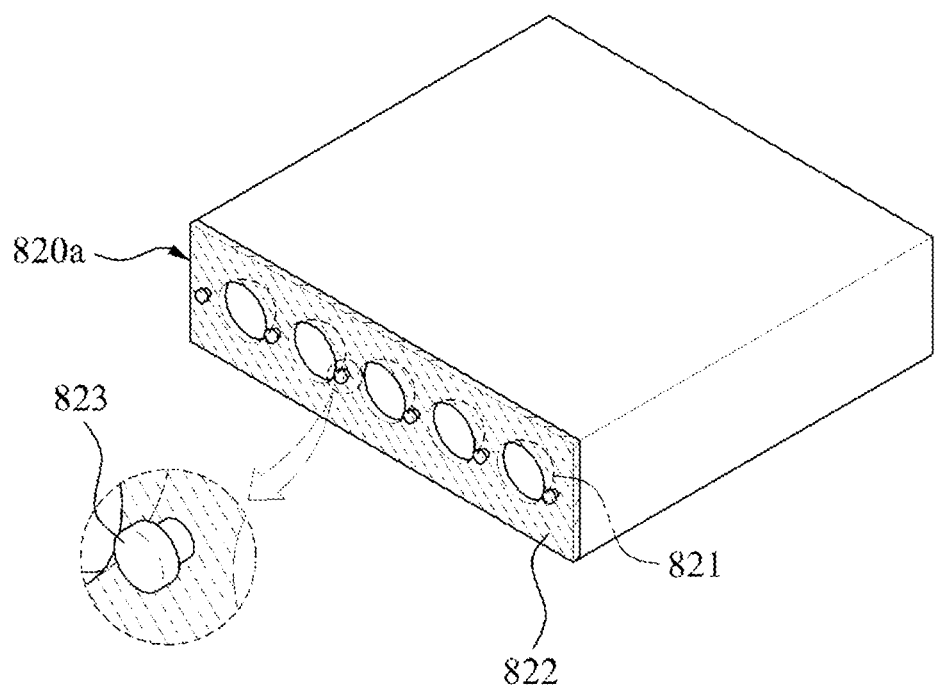

Referring to FIG. 18, the manufacturing method may include forming an adhesive layer 822 on an incidence surface 820a of the light guide panel 820. The incidence surface 820a may physically contact the surface of the substrate on which the LED chip 812 is mounted.

According to the present embodiment, bonding between the light guide panel 820 and the LED module 810 is not achieved by a transparent resin injected in an insertion recess 821. Accordingly, the adhesive layer 822 may be formed on the incidence surface 820a that physically contacts the LED module 810 when the light guide panel 820 is bonded to the LED module 810. In this case, the adhesive layer 822 may be disposed in a region excluding the insertion recess 821 on the incidence surface 820a to enable insertion of the transparent lens unit 813 in the insertion recess 821.

The manufacturing method may include forming at least one connection projection 823 disposed on the incidence surface 820a of the light guide panel 820. The connection projection 823 may be disposed in a region corresponding to the at least one connection recess 814 included in the substrate 811 and engaged with the at least one connection recess 814.

Figure 19:
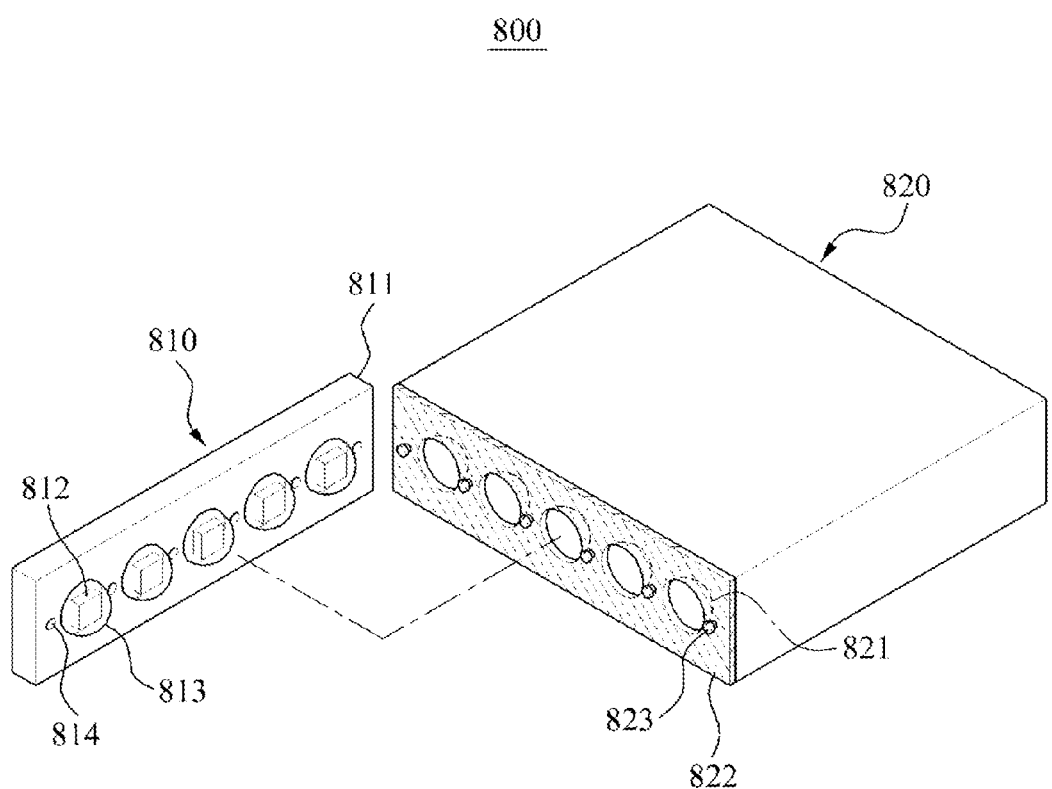

Referring to FIG. 19, the manufacturing method may include disposing the light guide panel 820 at one side of the LED module 810 such that the transparent lens unit 813 is inserted in the insertion recess 821. During this process, the incidence surface 820a of the light guide panel 820 may be bonded to the surface of the substrate 811 on which the LED chip 812 is mounted, through the adhesive layer 822. The connection projection 823 may be engaged with the connection recess 814, thereby improving bonding between the light guide panel 820 and the LED module 810.

Figure 20:
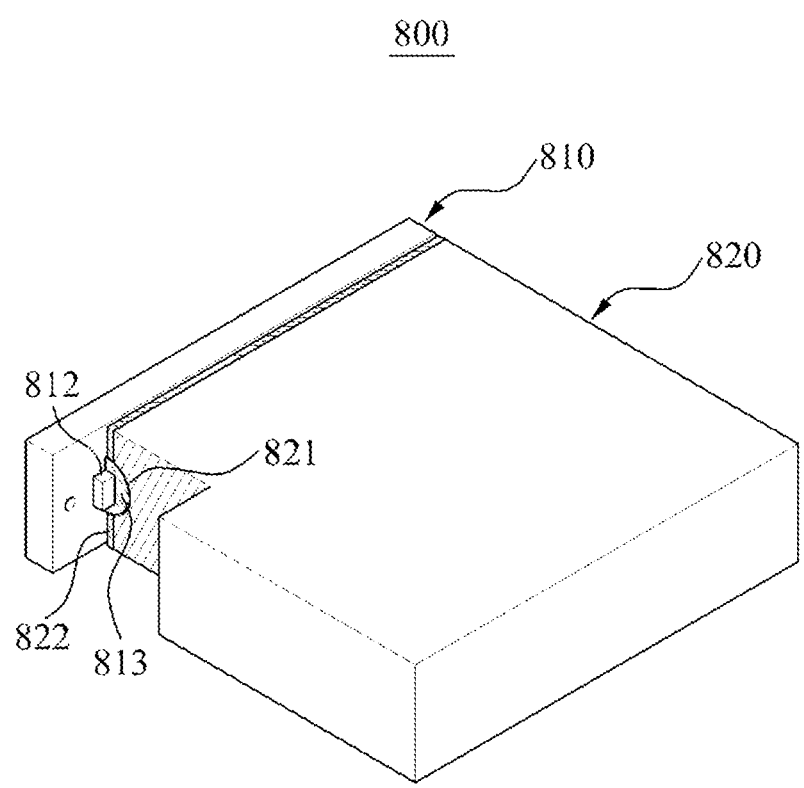

FIG. 20 shows a BLU 800 including the LED module 810 and the light guide panel 820. Referring to a partially cutaway surface in FIG. 20, the transparent lens unit 813 disposed on the LED chip 812 is inserted in the insertion recess 821 while the light guide panel 820 is bonded to the LED module 810 by the adhesive layer 822.

According to the example embodiments, since the BLU adopts a COB-type LED module with a reduced thickness, an outer thickness of the BLU may be reduced relative to a conventional packaged LED.

In addition, since a gap between the LED module and a light guide panel is removed, light emitted from the LED module may be incident upon the light guide panel without loss. As a result, light incidence efficiency may be increased relative to a conventional packaged LED.

Although a few example embodiments have been shown and described, the example embodiments are not limited to the described example embodiments. Instead, it would be appreciated by those skilled in the art that changes may be made to these example embodiments without departing from the principles and spirit of the invention, the scope of which is defined by the claims and their equivalents.

What is claimed is:

1. A backlight unit (BLU) comprising:
a light emitting diode (LED) module, the LED module including at least one LED chip that is chip-on-board (COB) mounted directly on a conductive substrate, the conductive substrate including at least one circuit pattern printed thereon that is electrically connected to an electrode of the LED chip such that the LED chip is COB mounted thereon; and
a light guide panel including an incidence surface configured to receive light emitted from an emission surface of the LED chip, the incidence surface including at least one insertion recess disposed corresponding to the LED chip, such that the LED chip is in the insertion recess and bonded to the LED module, wherein
the LED module further includes at least one connection recess disposed in a region excluding the LED chip on a surface of the substrate on which the LED chip is mounted, and
the light guide panel further includes at least one connection projection disposed in a region corresponding to the connection recess on the incidence surface, the connection projection configured to be engaged with the connection recess.

2. The BLU of claim 1, further comprising:
a transparent resin injected in the insertion recess to bond the LED chip.

3. The BLU of claim 1, wherein the insertion recess is formed on the incidence surface in a shape of a light extraction pattern, the light extraction pattern configured to maximize an efficiency of light emitted from the LED chip.

4. The BLU of claim 2, wherein the incidence surface comprises:
at least one receiving recess disposed in a region excluding the insertion recess, the at least one receiving recess configured to receive residue of the transparent resin.

5. The BLU of claim 2, wherein the substrate comprises:
at least one injection hole extending from a first surface of the substrate to a second surface surface of the substrate, the at least one injection hole configured as a path for injecting the transparent resin into the insertion hole.

6. The BLU of claim 5, wherein the injection hole is disposed in a region corresponding to the insertion recess on the substrate while excluding a region corresponding to the LED chip.

7. The BLU of claim 1, wherein the light guide panel further comprises:
an adhesive layer disposed in a region excluding the insertion recess on the incidence surface so as to bond the incident surface to a surface of the substrate.

8. The BLU of claim 1, wherein the LED module further includes a first alignment mark disposed on a surface of the substrate on which the LED chip is mounted, and
the light guide panel further includes a second alignment mark that matches the first alignment mark and is configured to guide the LED chip to be inserted in the insertion recess.

9. The BLU of claim 1, wherein the LED module further comprises:
a transparent lens unit applied on the LED chip.

10. A manufacturing method for a backlight unit (BLU), the method comprising:
mounting light emitting diode (LED) chips of an LED module directly onto a same conductive substrate, the conductive substrate including at least one circuit pattern printed on a first surface thereof that is electrically connected to an electrode of the LED chips such that the LED chips are chip-on-board (COB) mounted thereon;
forming insertion recesses on an incidence surface of a light guide panel, the incidence surface configured to receive light emitted from the LED chips;
forming at least one connection projection on the incidence surface of the light guide panel corresponding to at least one connection recess on the first surface of the substrate; and
bonding the LED chips to the incidence surface by inserting the LED chips into respective insertion recesses of the light guide panel, such that the incidence surface of the light guide panel directly contacts the first surface of the substrate.

11. The manufacturing method of claim 10, wherein the bonding of the light guide panel comprises:
injecting a transparent resin in the insertion recess to bond the LED chip; and
inserting the LED chip in the insertion recess and bonding the light guide panel to the LED chip by the transparent resin.

12. The manufacturing method of claim 10, wherein the bonding of the light guide panel comprises:
disposing the light guide panel at one side of the LED module such that the LED chip is inserted in the insertion recess; and
bonding the light guide panel to the LED chip by injecting a transparent resin in the insertion recess through at least one injection hole extending from a first exterior surface of the substrate to a second interior surface of the substrate.

13. The manufacturing method of claim 11, wherein the method further comprises:
applying a transparent lens unit on the LED chip.

14. The manufacturing method of claim 13, wherein the bonding of the light guide panel comprises:
forming an adhesive layer in a region excluding the insertion recess on the incidence surface;
disposing the light guide panel at one side of the LED module such that the transparent lens unit is inserted in the insertion recess; and
bonding the incidence surface to a surface of the substrate on which the LED chip is mounted by the adhesive layer.

15. The manufacturing method of claim 11, wherein the bonding of the light guide panel further comprises:
engaging at least one connection recess formed on the first surface of the substrate with the at least one connection projection formed on the incidence surface of the light guide panel.

16. The manufacturing method of claim 11, wherein the bonding of the light guide panel further comprises:
matching a first align mark disposed on a surface of the substrate, to a second align mark, the first align mark and the second align mark configured to guide the LED chip into the insertion recess on the incidence surface.

17. The BLU of claim 2, wherein the substrate comprises:
at least one receiving recess disposed in a region excluding the LED chip on a surface of the substrate on which the LED chip is mounted, the at least receiving recess configured to receive any excess residue of the transparent resin that flows out of the insertion recesses.

18. The manufacturing method of claim 11, further comprising;
forming first receiving recesses on the incidence surface of the light guide panel and corresponding second receiving recesses on the first surface of the substrate, wherein the first receiving recesses and the second receiving recesses are configured to receive any excess residue of the transparent resin that flows out of the insertion recesses.

* * * * *